United States Patent
Boulanger et al.

(10) Patent No.: US 10,014,817 B2
(45) Date of Patent: Jul. 3, 2018

(54) FLEXIBLE SOLAR GENERATOR PROVIDED WITH ELECTRICAL PROTECTION AGAINST THE IMPACT OF CELESTIAL OBJECTS, SPACECRAFT AND SATELLITE COMPRISING AT LEAST ONE SUCH SOLAR GENERATOR

(71) Applicant: THALES, Courbevoie (FR)

(72) Inventors: Bernard Boulanger, Frejus (FR); Jean-Noël Voirin, La Roquette sur Siagne (FR); Laurent D'Abrigeon, Callian (FR)

(73) Assignee: THALES, Courbevoie (FR)

( * ) Notice: Subject to any disclaimer, the term of this patent is extended or adjusted under 35 U.S.C. 154(b) by 142 days.

(21) Appl. No.: 15/273,435

(22) Filed: Sep. 22, 2016

(65) Prior Publication Data

US 2017/0093326 A1   Mar. 30, 2017

(30) Foreign Application Priority Data

Sep. 25, 2015   (FR) ..................... 15 01980

(51) Int. Cl.
*H02S 10/40* (2014.01)
*H02S 40/34* (2014.01)
*B64G 1/44* (2006.01)
*B64G 1/56* (2006.01)
*H01L 31/05* (2014.01)
(Continued)

(52) U.S. Cl.
CPC ............. *H02S 10/40* (2014.12); *B64G 1/443* (2013.01); *B64G 1/56* (2013.01); *H01L 31/02021* (2013.01); *H01L 31/0504* (2013.01); *H02J 3/383* (2013.01); *H02S 40/34* (2014.12); *Y02E 10/50* (2013.01)

(58) Field of Classification Search
CPC ......... H02S 10/40; H02S 40/34; B64G 1/443; B64G 1/56; H01L 31/0504; H01L 31/02021; H02J 3/383; Y02E 10/50
See application file for complete search history.

(56) References Cited

U.S. PATENT DOCUMENTS

2006/0225779 A1   10/2006   Boulanger
2009/0301544 A1   12/2009   Minelli

FOREIGN PATENT DOCUMENTS

CN   103 972 314 A   8/2014
EP   0 938 141 A2   8/1999

OTHER PUBLICATIONS

Mengu Cho et al., "Failure mechanisms and protection methods of spacecraft power system," Electrical Insulating Materials, vol. 1, Jun. 2005, pp. 45-48, XP010827647.

*Primary Examiner* — Robert Deberadinis
(74) *Attorney, Agent, or Firm* — Baker & Hostetler LLP

(57) ABSTRACT

A solar generator comprises a flexible support, an array of solar cells, electrical transfer conductors, blocking diodes, the solar cells being formed along different transverse strings, the solar cells situated in a same string being electrically connected in series, each string comprising two opposite ends, respectively of positive polarity and of negative polarity. The positive polarity end of each string of solar cells is individually connected to a respective blocking diode via an electrical transfer conductor dedicated to the string, the electrical transfer conductors dedicated to the different strings being independent of one another, the blocking diodes being located at the proximal end of the solar generator, outside of the array of solar cells.

12 Claims, 6 Drawing Sheets

(51) Int. Cl.
*H02J 3/38* (2006.01)
*H01L 31/02* (2006.01)

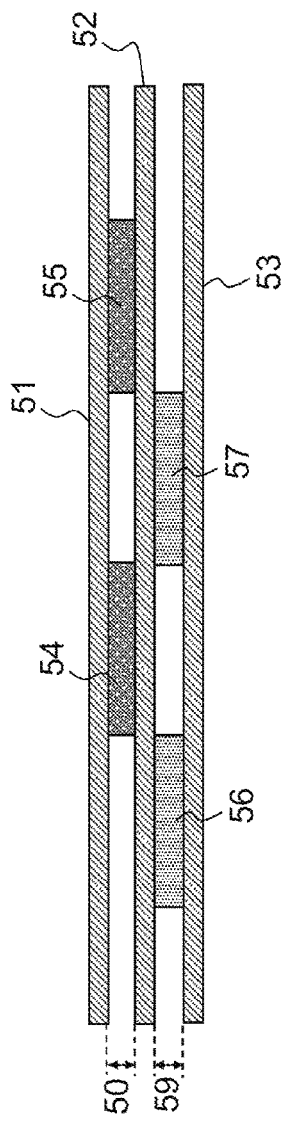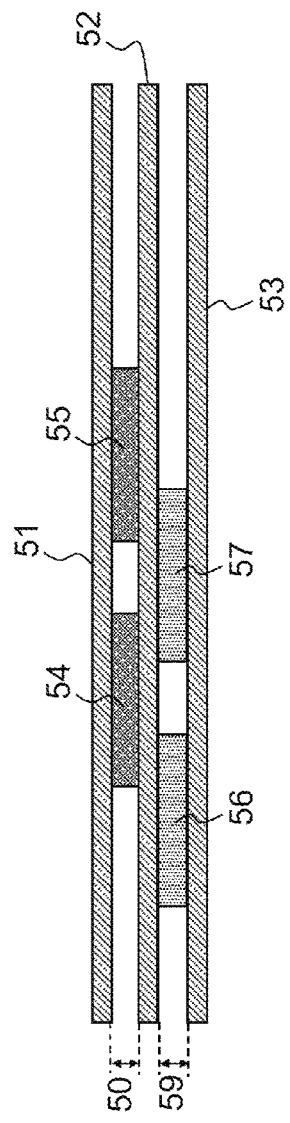
FIG.6a
FIG.6b

FLEXIBLE SOLAR GENERATOR PROVIDED WITH ELECTRICAL PROTECTION AGAINST THE IMPACT OF CELESTIAL OBJECTS, SPACECRAFT AND SATELLITE COMPRISING AT LEAST ONE SUCH SOLAR GENERATOR

CROSS-REFERENCE TO RELATED APPLICATION

This application claims priority to foreign French patent application No. FR 1501980, filed on Sep. 25, 2015, the disclosure of which is incorporated by reference in its entirety.

FIELD OF THE INVENTION

The present invention relates to a flexible solar generator provided with electrical protection against impacts from celestial objects, a spacecraft and a satellite comprising at least one such solar generator. It applies to any solar generator comprising a flexible support and, more particularly, to the field of space applications in which solar generators are mounted on spacecraft or on satellites in orbit.

BACKGROUND

The solar generators mounted on spacecraft, for example satellites, generally comprise, an array of solar cells electrically connected to one another and to the satellite, the solar cells, covering the surface of support panels being suitable for transforming the solar energy into electrical energy transmitted to the electrical equipment items of the satellite. The solar cells can be formed on a number of rigid solar panels or on a flexible support, for example a flexible membrane, the thickness of which is very much thinner than the thickness of the rigid solar panels. In effect, a flexible solar generator generally consists of a flexible support comprising a front face on which solar cells are mounted, each solar cell being provided with a glass protection window (cover glass), a rear face on which are formed electrical conductors and at least one layer of insulating material, for example Kapton, situated between the solar cells and the electrical conductors.

As represented in the electrical circuit diagram of FIG. 1, the solar cells formed on the flexible support 10 and situated on a same string of the solar generator are generally electrically connected in series, each string 11 comprising two ends 12, 13 with respectively positive and negative polarity. The ends 12, 13 with positive, respectively negative, polarity of several strings are then electrically connected to one another to form several different sections 15, 16, each section consisting of a set of several strings electrically connected in parallel. Two sections each consisting of three strings connected in parallel are represented in FIG. 1, but, generally, the number of strings per section and the number of sections are greater. Each section 15, 16 is then linked to the satellite 20 by two electrical power conductors 15a, 15b, 16a, 16b respectively of positive polarity and negative polarity, also called electrical transfer conductors, dedicated to transferring electrical power generated by the section to the satellite. The electrical transfer conductors 15a, 15b, 16a, 16b dedicated to the sections 15, 16 are generally formed under the solar cells, on the rear face of the flexible support 10 of the solar generator. Since the different sections are formed alongside one another in a same longitudinal direction of the solar generator, the electrical power conductors dedicated to the different sections pass under the solar cells of the neighboring sections and run under all the wing of the solar generator 10 before being connected to the satellite 20. For example, in FIG. 1, the electrical transfer conductors 15a, 15b of the section 15 run under the solar cells of the section 16.

The problem is that, in the case of the flexible solar generators, the distance separating the solar cells mounted on a front face of the flexible support and the electrical power conductors mounted on a rear face of the flexible support is very small, that is to say less than a millimetre. This small distance makes the solar generators very sensitive to impacts from celestial objects, in particular to impacts from debris and from micrometeorites. In effect, the impacts, for example, from debris or from micrometeorites can locally pierce one or more solar cells as well as the insulating materials and the power conductors situated under the solar cell. The impact creates a plasma bubble which, when the electrical voltage between the impacted solar cell and the electrical conductor is sufficient, for example greater than 50 Volts, can generate an electrical arc 14 between said impacted solar cell and the electrical conductor placed under that solar cell. If the electrical current available at the point of the impact is sufficiently high, for example greater than 1.5 Ampere, the electrical arc can be self-sustaining, which has the effect of creating a permanent short circuit in a section of the solar generator and a definitive loss of a part of the electrical power.

To protect the solar cells against any discharge currents originating from the other strings of the section, each string is generally provided, at its positive polarity end, with a blocking diode 17 making it possible to insulate the strings from one another and to limit the intensity of the electrical current in each string to a value less than 1.5 Ampere. However, since these blocking diodes are located on the flexible support, as close as possible to the solar cells, they provide protection against the electrical arcs generated between solar cells of neighboring strings but do not protect against electrical arcs generated between the solar cells and the electrical transfer conductors, in particular the electrical transfer conductors that have a positive polarity, which run under the solar cells and which are connected at the output of a section of the solar generator. Now, at the point of impact, the voltage of an electrical transfer conductor having a positive polarity can be very much greater than the voltage of the cell impacted, for example for a string comprising 50 solar cells connected in series, the voltage of an electrical transfer conductor having a positive polarity can reach 100 Volts whereas the voltage of the negative polarity end of the first cell of a string is equal to 0 Volt. Furthermore, the intensity of the electrical current circulating in an electrical transfer conductor connected at the output of a section is high, generally very much greater than 1.5 Ampere. When a micrometeorite passes through the solar generator and makes a hole in a solar cell and in the insulating material between the solar cell and an electrical transfer conductor with positive polarity situated under the solar cell, an electrical arc is created and is self sustaining between the electrical power conductor and the impacted solar cell. A short circuit is then generated between the impacted cell and the electrical transfer conductor 15a with positive polarity which passes under said impacted cell. An electrical arc current I then circulates from the electrical transfer conductor 15a with positive polarity to an electrical transfer conductor 16b with negative polarity linked to the negative end of the string of solar cells in which the impact has occurred. Since the electrical transfer conductors with negative polarity are all linked together in the satellite 20, the electrical arc current I returns in the reverse direction, via an electrical transfer conductor with negative polarity, into the electrical circuit of the section 15 which passes under the impacted cell. Said section 15 is then short circuited and can no longer supply power to the solar generator. This loss of power corresponding to the loss of a complete section 15 of the solar generator is prejudicial to the electrical power supply for the equipment items on board the satellite.

To avoid electrical arcs being created between a solar cell and an electrical transfer conductor, it is possible to have the transfer conductors run on the edges of the solar generator instead of having them run on the rear face, under the solar cells. However, the electrical transfer conductors also provide a shielding role for the rear face of the solar generator against radiations, notably electron fluxes and photon fluxes, which degrade the electrical performance levels of the solar cells causing the available electrical power to be reduced. Consequently, if the electrical transfer conductors are moved to the edges of the solar generator, they can no longer ensure the shielding role and it is then necessary to add a specific shielding device to protect the rear face of the solar generator, which increases the weight of the solar generator.

SUMMARY OF THE INVENTION

One aim of the invention is to remedy the drawbacks of the known flexible solar generators and produce a flexible solar generator comprising an electrical protection against impacts from celestial objects, in particular debris and micrometeorites, which makes it possible to limit the intensity of the electrical current between the solar cells and electrical transfer conductors situated under the solar cells without penalizing the electrical power generated by the solar generator, to enhance the withstand strength of the solar generator and avoid the loss of power upon the creation of a permanent electrical arc between a solar cell holed by an impact and an electrical transfer conductor running under the impacted solar cell.

Another aim of the invention is to produce a flexible solar generator comprising an electrical protection against impacts from celestial objects, further making it possible to ensure the shielding of the rear face of the solar generator without increasing the weight, or the bulk, of the solar generator, compared to the known flexible solar generators.

For that, the invention relates to a solar generator intended to be fixed onto a spacecraft, the solar generator comprising a flexible support extending along a longitudinal deployment axis Y and having a proximal end intended to be linked to the spacecraft and a distal end opposite the proximal end, an array of solar cells formed on a front face of the flexible support and blocking diodes. The solar cells are formed along different transverse strings spaced apart from one another and electrically independent of one another, the solar cells situated in a same transverse string being electrically connected in series, each transverse string comprising two opposite ends, respectively of positive polarity and of negative polarity. The flexible support consists of a multilayer substrate equipped with electrical transfer conductors running under the transverse strings. The positive polarity end of each transverse string is individually and directly linked to a dedicated electrical transfer conductor, the electrical transfer conductors dedicated to the different transverse strings being independent of one another, and each electrical transfer conductor linked to the positive polarity end of a transverse string comprises a proximal end connected to a blocking diode located at the proximal end of the solar generator, outside of the array of solar cells.

Advantageously, the multilayer substrate comprises at least two layers of electrical insulating material located between the electrical transfer conductors and the solar cells glued onto the front face of the flexible support, the electrical transfer conductors being able to be formed on a rear face of the flexible support.

Alternatively, the multilayer substrate can comprise at least two layers of electrical insulating material and a flexible printed circuit comprising at least one layer of etched conductive tracks sandwiched between the two layers of electrical insulating material, the electrical transfer conductors consisting of the etched conductive tracks.

Alternatively, the multilayer substrate can comprise three layers of electrical insulating material and a flexible printed circuit comprising two stacked layers provided with etched conductive tracks, each layer, respectively first layer and second layer, of etched conductive tracks being respectively sandwiched between two layers of electrical insulating material of the flexible support, the electrical transfer conductors consisting of the etched conductive tracks.

Advantageously, the etched conductive tracks situated in the second of the two stacked layers can be arranged staggered relative to the etched conductive tracks situated in the first of the two stacked layers.

Alternatively, the etched conductive tracks situated in the second of the two stacked layers and the etched conductive tracks situated in the first of the two stacked layers can partially overlap one another.

Advantageously, the blocking diodes can be located on the flexible support, at the proximal end of the solar generator, in a clear zone free of solar cells.

Alternatively, the solar generator can further comprise a mechanical interface to which the flexible support is fixed, and the blocking diodes can be located on the mechanical interface, outside of the flexible support.

Advantageously, the solar generator can comprise a power conditioning device located outside of the flexible support and intended to manage the electrical energy delivered by all the transverse strings, the power conditioning device being connected to all the electrical transfer conductors, the power conditioning device comprising electrical connection means suitable for connecting, in parallel, a number of electrical transfer conductors respectively linked to the positive polarity ends of different corresponding transverse strings, to form different solar cell sections.

Advantageously, the blocking diodes can be located in the power conditioning device, and the electrical connection means can be connected at the output of the blocking diodes.

The invention also relates to a spacecraft and a satellite comprising at least one such solar generator.

BRIEF DESCRIPTION OF THE DRAWINGS

Other particular features and advantages of the invention will become clearly apparent hereinafter in the description given by way of purely illustrative and nonlimiting example, with reference to the attached schematic drawings which represent:

FIGS. 6a and 6b: two diagrams in transverse cross section, respectively a) without overlapping of the tracks, b) with overlapping of the tracks, of an example of flexible support consisting of a multilayer substrate comprising a printed circuit provided with two layers of conductive tracks, etched, each layer of etched tracks being sandwiched between two layers of insulating material, according to the invention.

DETAILED DESCRIPTION

Figure 1:
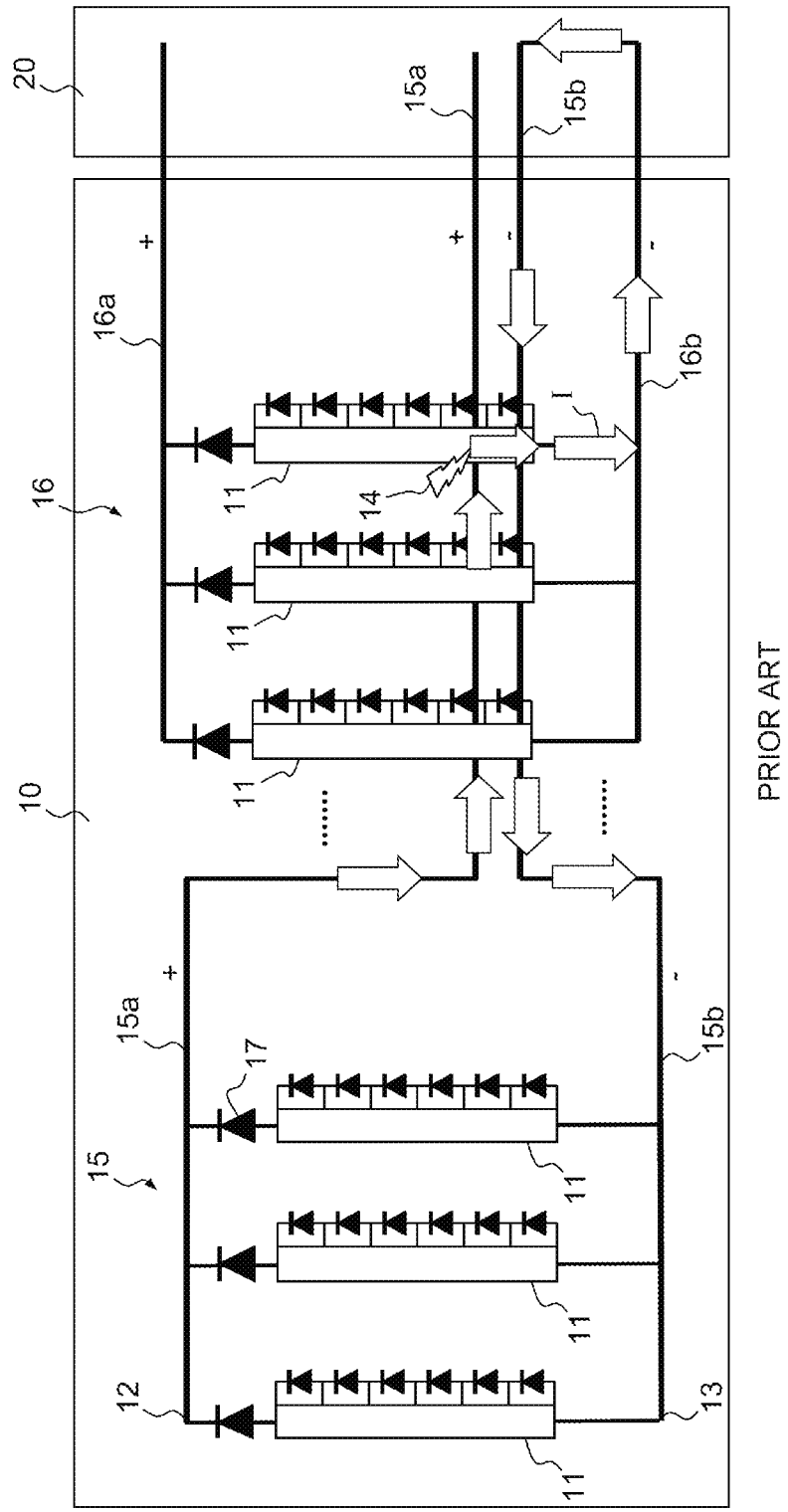
FIG. 1: a diagram of an example of electrical wiring of the solar cells of a solar generator, according to the prior art.
Figure 2:
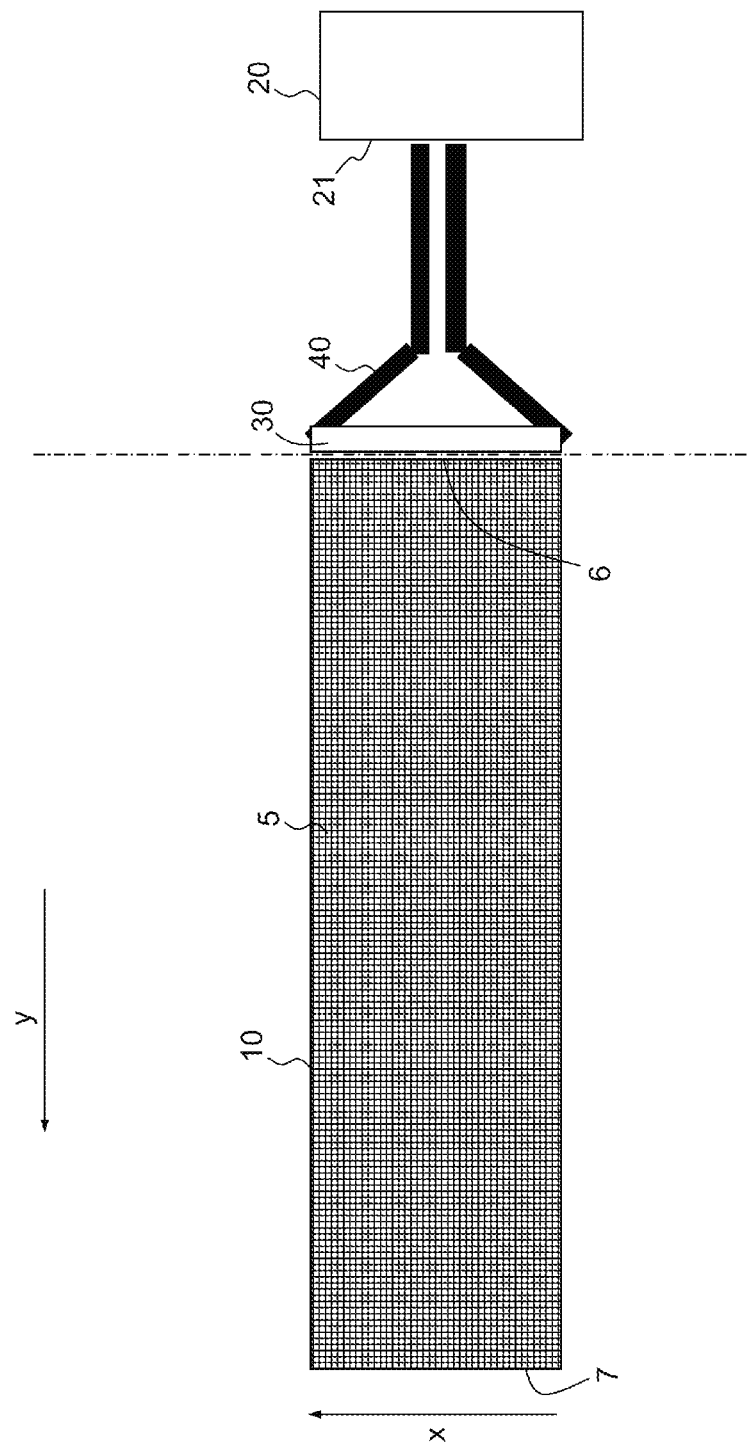
FIG. 2: a diagram illustrating a satellite provided with a flexible solar generator, in deployed position, according to the invention.

Generally, a spacecraft, for example a satellite, comprises solar generator wings intended to provide the electrical power necessary to the operation of the equipment items mounted on the satellite. The number of solar generator wings depends on the mission to be carried out by the spacecraft. Often, two solar generator wings are mounted symmetrically on either side of a spacecraft, on two opposite flanks of the spacecraft. To optimize the illumination of the solar generator wings, the solar generators of each wing are generally fixed at the end of a yoke intended to be fixed onto a flank of the spacecraft. In the example of FIG. 2, to simplify the description of the invention, a single solar generator wing is represented, but obviously the number of solar generator wings can be greater than one.

According to the invention, the solar generator extends along a longitudinal deployment axis Y and has a proximal end 6 intended to be linked to the spacecraft and a distal end 7 opposite the proximal end. The solar generator comprises a planar flexible support 10 equipped with electrical transfer conductors 120, 130 and an array of solar cells 5 formed on a front face of the flexible support. The flexible support can be fixed directly to a yoke 40 or, alternatively, to a mechanical interface 30 mounted at a first end of a yoke 40, the yoke 40 comprising a second end intended to be fixed onto a flank 21 of the spacecraft 20. In deployed position, the flexible support 10 consists of a planar surface extending along a plane XY, the direction Y being orthogonal to the flank 21 of the spacecraft 20 onto which the yoke 40 is intended to be fixed. The array of solar cells 5 mounted on the front face of the flexible support 10 is located between the proximal 6 and the distal 7 ends of the solar generator. In one embodiment of the invention, the array of solar cells may not extend to the proximal end to leave, on the front face of the flexible support, at the proximal end, a clear zone 8 free of solar cells.

Figure 3:
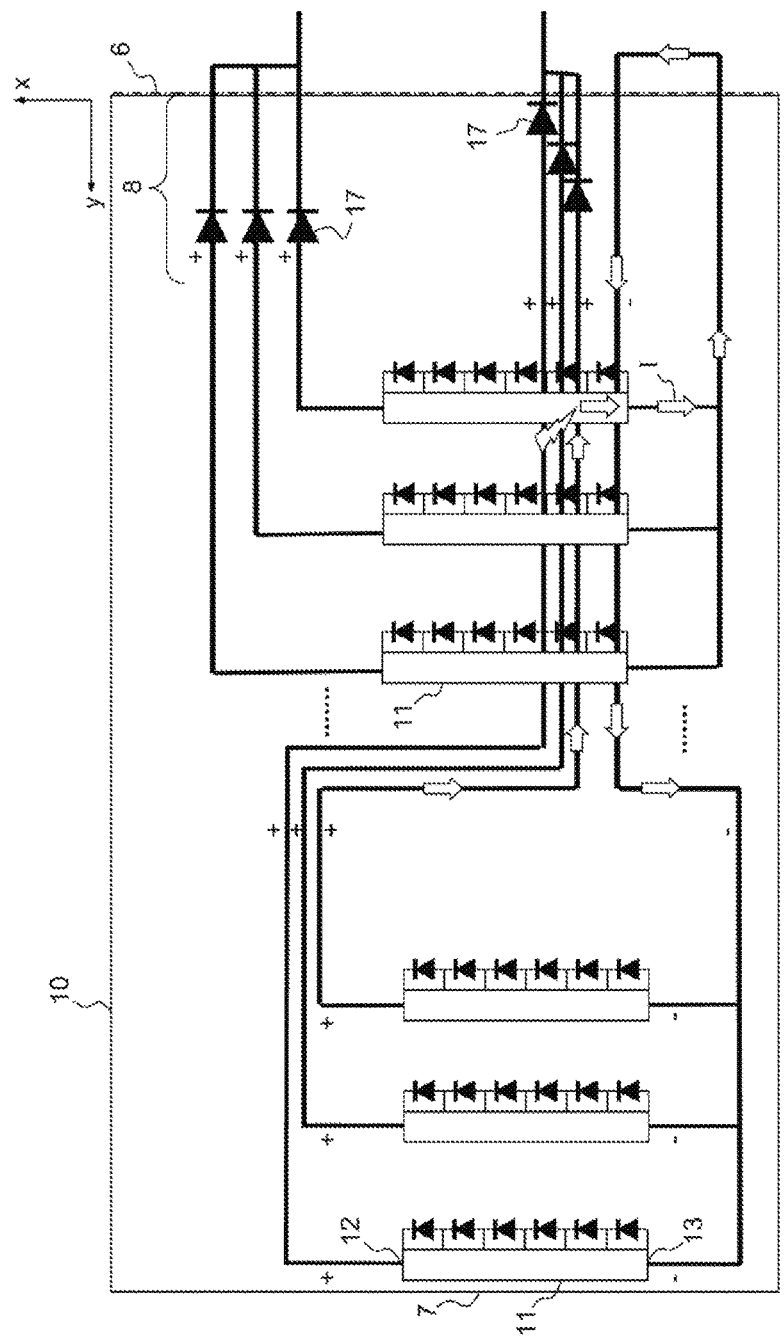
FIG. 3; a diagram of an example of electrical wiring of the solar cells of a solar generator, the blocking diodes being mounted on the flexible support, according to a first embodiment of the invention.
Figure 4:
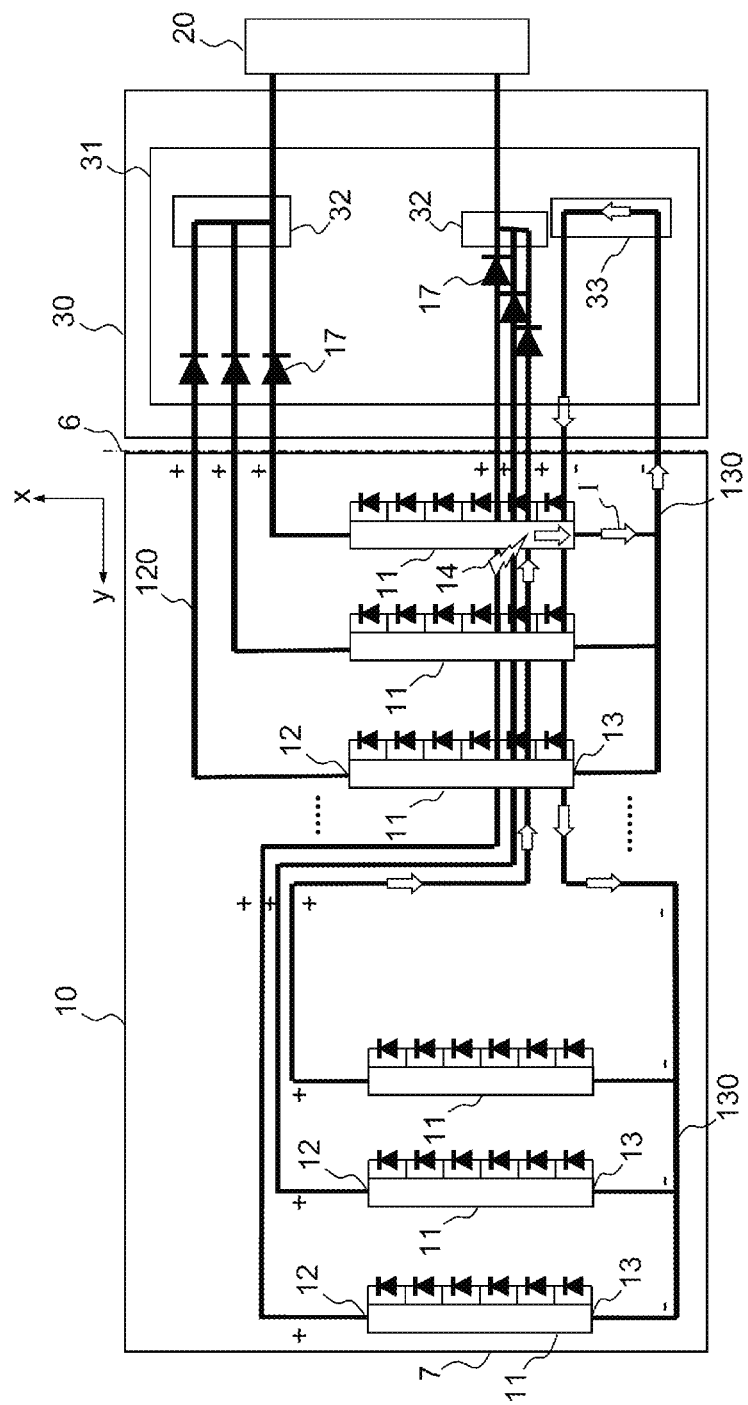
FIG. 4: a diagram of a variant of the electrical wiring of the solar cells of a solar generator, the blocking diodes being mounted outside of the flexible support, according to a second embodiment of the invention.

The diagrams of FIGS. 3 and 4 illustrate examples of electrical wiring of the solar cells, according to the invention. As illustrated in these examples, the solar cells of the array can be formed along different transverse strings 11, spaced apart from one another. The strings 11 of solar cells can be parallel to one another and to the direction X, but this is not essential. The solar cells situated on a same string 11 of the solar generator are electrically connected in series, the different strings of solar cells being electrically independent of one another and comprising two ends 12, 13 with respectively positive and negative polarity. The two ends of each string 11 of solar cells are respectively linked to two dedicated electrical transfer conductors 120, 130, intended to transmit the energy, of respectively positive and negative polarity, generated by the string 11 of solar cells to a power conditioning device 31 located outside of the flexible support, for example on the mechanical interface 30 as represented in FIG. 4, or into the spacecraft 20. The electrical transfer conductors 120, 130, are formed longitudinally, under the transverse strings 11. The electrical transfer conductors 120, 130 therefore run transversely relative to the strings 11 of solar cells and pass successively under the different strings 11 of solar cells of the array formed on the front face of the flexible support, between the string 11 concerned and the proximal end 6. The positive polarity end 12 of each transverse string 11 is individually and directly linked to a dedicated electrical transfer conductor 120. The electrical transfer conductors 120, 130 dedicated to each string 11 of solar cells are directly linked to the power conditioning device, situated outside of the flexible support 10. Each transverse string 11 is therefore individually linked to the power conditioning device 31, which makes it possible to process the electrical power, generated by the solar generator, outside of the flexible support 10 and to limit the intensity of the electrical currents circulating in the transfer conductors 120 with positive polarity, situated on the rear face of the flexible support, since the electrical current then corresponds to that created by a single string of the solar generator. In the power conditioning device 31, the transfer conductors 120 with positive polarity, dedicated to each transverse string, are connected to a respective blocking diode 17, each blocking diode being dedicated to the protection of a transverse string of the solar generator against discharge currents originating from the other transverse strings. To have redundancy, there can be two electrical transfer conductors dedicated to each string of solar cells and one blocking diode linked to the two corresponding electrical transfer conductors. The different blocking diodes are located at the proximal end 6 of the solar generator, outside of the array of solar cells. For example, as represented in FIG. 3, the blocking diodes 17 can be located on the flexible support 10, at the proximal end 6 of the solar generator, in the clear zone 8 free of solar cells, on the front or rear face, or, alternatively, outside of the flexible support, for example on the mechanical interface 30, as represented in FIG. 4, or in the spacecraft 20. At the output of the blocking diodes 17, the power conditioning device comprises first and second connection means 32, 33 suitable for grouping together the strings 11 of solar cells into different sections, each section comprising several strings of solar cells linked in parallel. In each section, the first connection means 32 connect electrical transfer conductors of positive polarity dedicated to the strings of the section. The electrical transfer conductors 130 of negative polarity are all linked together by the second connection means 33, in the power conditioning device 31.

Figure 5:
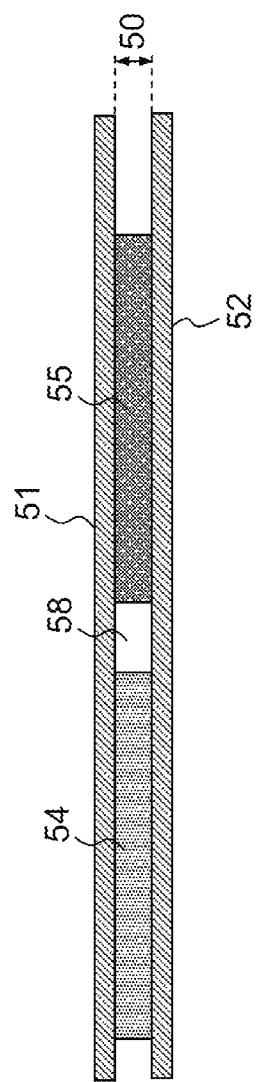
FIG. 5: a cross-sectional diagram of an example of flexible support consisting of a multilayer substrate comprising a single-layer printed circuit incorporated between two layers of insulating material, according to the invention.

The flexible support consists of a planar multilayer substrate comprising electrical transfer conductors and at least two layers of electrical insulating material, for example of Kapton, located between the electrical transfer conductors and the solar cells glued onto the front face of the flexible support. The electrical transfer conductors can consist of electrical cables formed on the rear face of the flexible support 10. Alternatively, the electrical transfer conductors can consist of conductive tracks, for example of silver, etched on a flexible printed circuit, the printed circuit being incorporated in the multilayer substrate of the flexible support 10. The printed circuit can be single-layer as represented in FIG. 5, or multilayer as represented in FIGS. 6a and 6b. When the printed circuit is single-layer, the layer 50 of the printed circuit is sandwiched between two layers of electrical insulating material 51, 52 of the flexible support and the different tracks 54, 55 of the layer 50 are insulated from one another by a space 58. Because of the space 58 between the tracks 54, 55, this configuration does not make it possible to ensure a complete shielding of the rear face of the flexible support. When the printed circuit is multilayer, as in FIG. 6a, the tracks 54, 55, 56, 57 of the printed circuit can be arranged staggered in two different layers 59, 50, respectively lower and upper, stacked one above the other, each layer 59, 50 of etched tracks being sandwiched between two layers of electrical insulating material 51, 52, 53 of the flexible support. In this configuration, as in FIG. 6b, there can be a partial overlap between the tracks of the upper layer 50 of the printed circuit and the tracks of the lower layer 59 of the printed circuit. This configuration therefore makes it possible to ensure a complete shielding of the rear face of the flexible support.

The mutually independent strings 11, not being grouped together in sections on the flexible support 10, each electrical transfer conductor 120 with positive polarity which runs under the solar cells, transports the electrical energy generated by a single string of solar cells to the mechanical interface 30. All the electrical transfer conductors 120 with positive polarity, dedicated to the different strings, are therefore independent of one another. The electrical current circulating in the electrical transfer conductors is therefore low, that is to say less than 1.5 Ampere. Consequently, in case of impact, for example of debris or of a micrometeorite, on a string 11 of solar cells, the electrical arc 14 created by the impact will go out because the discharge current is limited to that of the single string 11 impacted, by virtue of the blocking diode 17 dedicated to the protection of this impacted string 11.

Furthermore, since the blocking diodes 17 are located outside of the array of solar cells, all the surface of the solar generator is protected against any discharge currents originating from any string 11. In the presence of an impact hole in a string of the solar generator, a single string will possibly be short circuited and no longer supply power, as the arrows symbolizing the path of the short-circuit current I show in FIGS. 3 and 4. The loss of power of the solar generator, limited to that created by a string 11, will therefore be much less than in the current flexible solar generators.

In the presence of an impact hole on two superposed electrical conductors, insulated and of different polarities, on the surface of the duly protected solar generator, the current is also limited in the case of an electrical arc between the electrical conductor of positive polarity and the electrical conductor of negative polarity. This protection is effective against the electrical arcs between the solar cells and the electrical conductors, but also between the electrical conductors of different polarities.

The mechanical interface 30 can, for example, be mounted on the yoke 40 linked to the spacecraft 20 as illustrated in FIG. 2, or be directly mounted on the spacecraft 20.

The electrical transfer conductors 120, 130, situated on the rear face of the flexible support or incorporated in the substrate of the flexible support, and running transversely relative to the strings 11 of solar cells, further ensure a shielding function for the rear face of the solar generator without it being necessary to add an additional specific shielding. The weight and the bulk of the solar generator are thus optimized.

Although the invention has been described in conjunction with particular embodiments, it is obvious that it is in no way limited thereto and that it comprises all the technical equivalents of the means described as well as their combinations if the latter fall within the scope of the invention.

The invention claimed is:

1. A solar generator intended to be fixed onto a spacecraft, wherein the solar generator comprises a flexible support extending along a longitudinal deployment axis Y and having a proximal end intended to be linked to the spacecraft and a distal end opposite the proximal end, an array of solar cells formed on a front face of the flexible support and blocking diodes, the solar cells being formed along different transverse strings spaced apart from one another and electrically independent of one another, the solar cells situated in a same transverse string being electrically connected in series, each transverse string comprising two opposite ends, respectively of positive polarity and of negative polarity, wherein the flexible support consists of a multilayer substrate equipped with electrical transfer conductors running under the transverse strings, wherein the positive polarity end of each transverse string is individually and directly linked to a dedicated electrical transfer conductor, the electrical transfer conductors dedicated to the different transverse strings being independent of one another, and wherein each electrical transfer conductor linked to the positive polarity end of a transverse string comprises a proximal end connected to a blocking diode located at the proximal end of the solar generator, outside of the array of solar cells.

2. The solar generator according to claim 1, wherein the multilayer substrate comprises at least two layers of electrical insulating material located between the electrical transfer conductors and the solar cells glued onto the front face of the flexible support, the electrical transfer conductors being formed on a rear face of the flexible support.

3. The solar generator according to claim 1, wherein the multilayer substrate comprises at least two layers of electrical insulating material and a flexible printed circuit comprising at least one layer of etched conductive tracks sandwiched between the two layers of electrical insulating material, the electrical transfer conductors consisting of the etched conductive tracks.

4. The solar generator according to claim 3, wherein the multilayer substrate comprises three layers of electrical insulating material and a flexible printed circuit comprising two stacked layers provided with etched conductive tracks, each layer, respectively first layer and second layer, of etched conductive tracks being respectively sandwiched between two layers of electrical insulating material of the flexible support, the electrical transfer conductors consisting of the etched conductive tracks.

5. The solar generator according to claim 4, wherein the etched conductive tracks situated in the second of the two stacked layers are arranged staggered relative to the etched conductive tracks situated in the first of the two stacked layers.

6. The solar generator according to claim 5, wherein the etched conductive tracks situated in the second of the two stacked layers, and the etched conductive tracks situated in the first of the two stacked layers partially overlap one another.

7. The solar generator according to claim 1, wherein the blocking diodes are located on the flexible support, at the proximal end of the solar generator, in a clear zone free of solar cells.

8. The solar generator according to claim 1, further comprising a mechanical interface to which the flexible support is fixed, the blocking diodes being located on the mechanical interface, outside of the flexible support.

9. The solar generator according to claim 1, further comprising a power conditioning device located outside the flexible support and intended to manage the electrical energy delivered by all the transverse strings, the power conditioning device being connected to all the electrical transfer conductors, the power conditioning device comprising electrical connection means suitable for connecting, in parallel, a number of electrical transfer conductors respectively linked to the positive polarity ends of different corresponding transverse strings, to form different solar cell sections.

10. The solar generator according to claim 9, wherein the blocking diodes are located in the power conditioning device, and wherein the electrical connection means are connected at the output of the blocking diodes.

11. A spacecraft comprising at least one solar generator according to claim 1.

12. The spacecraft according to claim 11, consisting of a satellite.

* * * * *